United States Patent
Oka et al.

(12)

(10) Patent No.: US 10,515,914 B2
(45) Date of Patent: Dec. 24, 2019

(54) SINTERED SOLDER FOR FINE PITCH FIRST-LEVEL INTERCONNECT (FLI) APPLICATIONS

(71) Applicant: Intel Corporation, Santa Clara, CA (US)

(72) Inventors: Mihir A. Oka, Chandler, AZ (US); Ken P. Hackenberg, Plano, TX (US); Vijay Krishnan (Vijay) Subramanian, Gilbert, AZ (US); Neha M. Patel, Chandler, AZ (US); Nachiket R. Raravikar, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/260,908

(22) Filed: Jan. 29, 2019

(65) Prior Publication Data

US 2019/0157225 A1 May 23, 2019

Related U.S. Application Data

(62) Division of application No. 15/394,460, filed on Dec. 29, 2016, now Pat. No. 10,224,299.

(51) Int. Cl.
*H01L 23/48* (2006.01)
*H01L 23/52* (2006.01)
(Continued)

(52) U.S. Cl.
CPC .............. *H01L 24/05* (2013.01); *H01L 24/03* (2013.01); *H01L 24/11* (2013.01); *H01L 24/13* (2013.01);
(Continued)

(58) Field of Classification Search
CPC ......... H01L 24/03; H01L 24/05; H01L 24/19; H01L 24/20
(Continued)

(56) References Cited

U.S. PATENT DOCUMENTS

2003/0066679 A1 4/2003 Castro
2007/0085175 A1 4/2007 Lu et al.
(Continued)

FOREIGN PATENT DOCUMENTS

WO WO 2011090570 7/2011

OTHER PUBLICATIONS

International Search Report and Written Opinion for PCT/US2017/063151, dated Feb. 23, 2018, 30 pages.
(Continued)

*Primary Examiner* — David S Blum
(74) *Attorney, Agent, or Firm* — Schwabe, Williamson & Wyatt, P.C.

(57) ABSTRACT

Foundation layers and methods of forming a foundation layer are described. Die pads are formed over a die. A dielectric layer is formed over die pads and the die. The dielectric layer is then recessed to expose top portions of the die pads. A first plurality of sintered conductive vias are formed over the die pads. The first sintered conductive vias are coupled to at least one of the die pads. In addition, a photoresist layer may be formed over the dielectric layer and the top portions of the die pads. Via openings are formed in the photoresist layer. A second plurality of sintered conductive vias may then be formed over the first sintered conductive vias to form a plurality of sintered conductive lines. Each of the first and second sintered conductive vias are formed with a liquid phase sintering (LPS) solder paste.

19 Claims, 10 Drawing Sheets

(51) Int. Cl.
  *H01L 29/40*   (2006.01)
  *H01L 23/00*   (2006.01)

(52) U.S. Cl.
  CPC .............. *H01L 24/19* (2013.01); *H01L 24/20* (2013.01); *H01L 2224/02311* (2013.01); *H01L 2224/02371* (2013.01); *H01L 2224/03002* (2013.01); *H01L 2224/0401* (2013.01); *H01L 2224/05009* (2013.01); *H01L 2224/11002* (2013.01); *H01L 2224/1131* (2013.01); *H01L 2224/11622* (2013.01); *H01L 2224/11849* (2013.01); *H01L 2224/13009* (2013.01); *H01L 2224/13022* (2013.01); *H01L 2224/13025* (2013.01); *H01L 2224/16145* (2013.01); *H01L 2224/211* (2013.01); *H01L 2224/8113* (2013.01); *H01L 2224/81132* (2013.01); *H01L 2924/014* (2013.01); *H01L 2924/3841* (2013.01)

(58) Field of Classification Search
  USPC .......................................................... 257/774
  See application file for complete search history.

(56) References Cited

U.S. PATENT DOCUMENTS

| 2007/0167005 | A1 | 7/2007 | Ahn et al. |
| 2015/0228616 | A1* | 8/2015 | Palm ....................... H01L 21/78 257/676 |
| 2015/0279804 | A1 | 10/2015 | Raravikar et al. |
| 2016/0268223 | A1 | 9/2016 | Burgess et al. |

OTHER PUBLICATIONS

International Preliminary Report on Patentability for International Patent Application No. PCT/US2017/063151, dated Jul. 11, 2019, 12 pages.

* cited by examiner

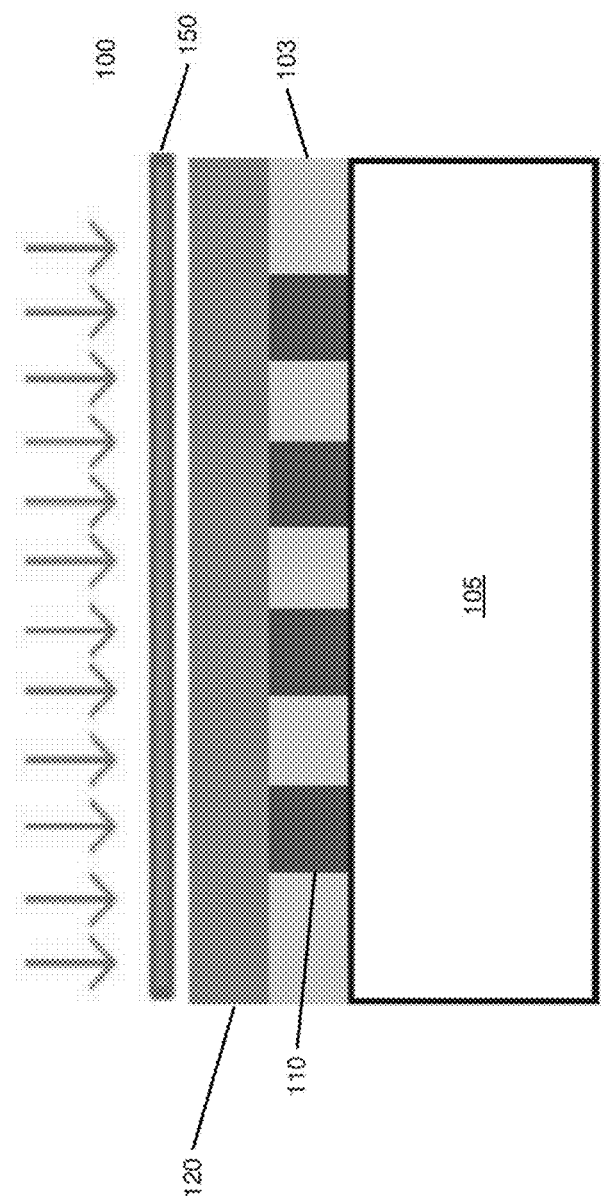
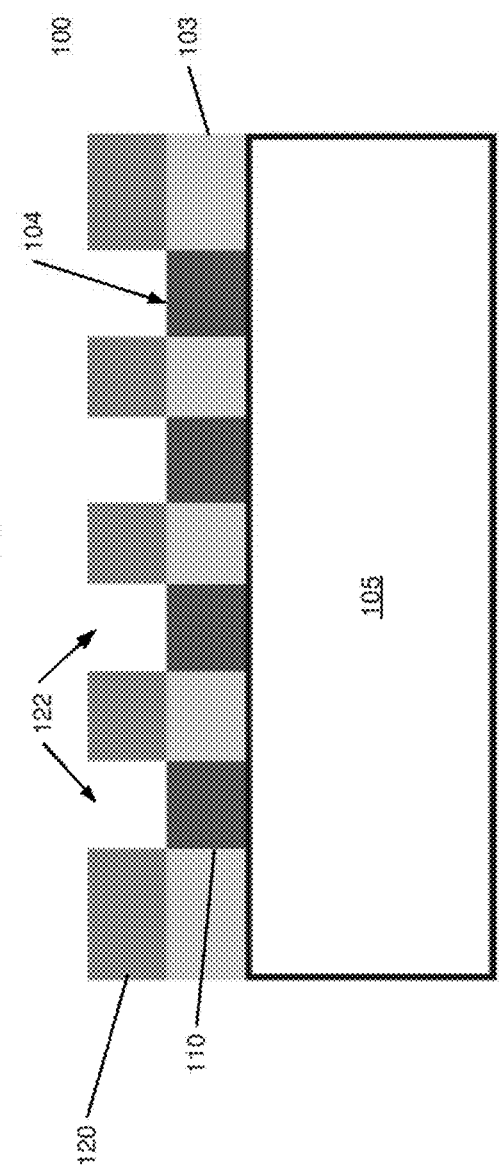

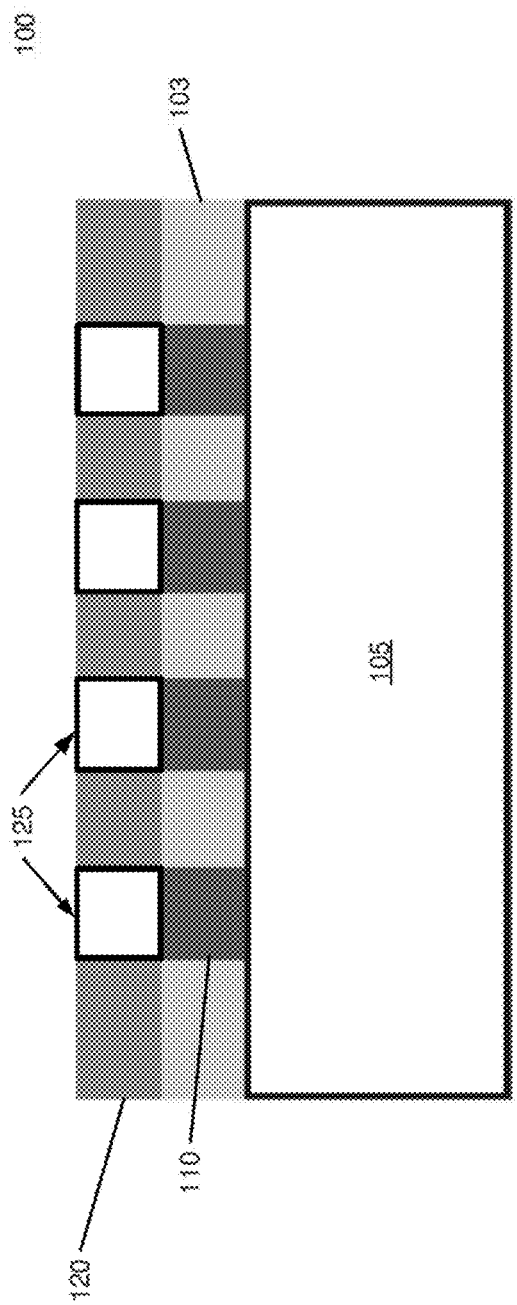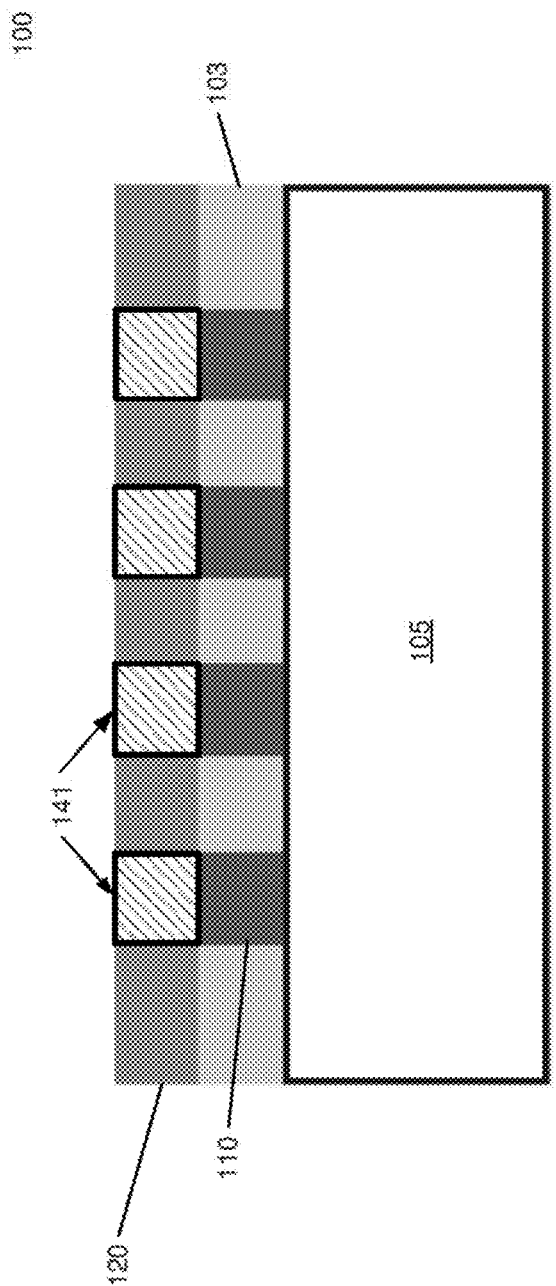

800

```
Form a dielectric layer and a die pad over a die in a foundation layer.
805
          ↓
Deposit a photoresist layer over the dielectric layer, the die pad, and the die.
810
          ↓
Pattern the first photoresist layer with a mask and a radiation source.
815
          ↓
Form a via opening over the die pad (i.e., post laser ablation).
820
          ↓
Deposit a LPS solder paste into the via opening to form a sintered conductive via.
825
          ↓
Reflow/sinter the LPS solder paste to form the sintered conductive via.
830
          ↓
Remove the photoresist layer from the foundation layer.
835
```

FIG. 8

SINTERED SOLDER FOR FINE PITCH FIRST-LEVEL INTERCONNECT (FLI) APPLICATIONS

CROSS-REFERENCE TO RELATED APPLICATIONS

This application is a division of U.S. patent application Ser. No. 15/394,460, now U.S. Pat. No. 10,224,229, filed on Dec. 29, 2016, the entire contents of which is hereby incorporated by reference herein.

FIELD

Embodiments relate to semiconductor devices. More particularly, the embodiments relate to packaging semiconductor devices with sintered solder for fine pitch first-level interconnect (FLI) layers.

BACKGROUND

To meet the demand for miniaturization of form factors and high performance integration, electronic packaging technologies have provided multiple packaging solutions. One electronic packaging solution is solder on die (SOD) with solder paste printing (SPP). For example, SOD may be used with a SPP process in an embedded multi-die interconnect packaging technology. The SOD with SPP process enables a tall solder height for fine pitch interconnects. SOD with SPP, however, requires multiple paste printings and reflows. Disadvantages of multiple reflows are increased resist cross-linking that adversely impacts the photoresist stripability, increased flux interaction with photoresist that leads to flux absorption by the photoresist, and increased post strip photoresist residue and/or missing solder.

Another disadvantage of SOD with SPP occurs during chip (or die) attach using thermal compression bonding (TCB). A major problem encountered during TCB of SOD dies is the inconsistent wicking of solder on copper posts, which may lead to merged solder bumps (bridging) and non-contact opens. One common type of packaging solution that is used to reduce inconsistent wicking during TCB is solder volume reduction. A disadvantage, however, of this solder volume reduction is that it results in smaller chip gaps for underfills.

An additional problem of SOD with traditional solder pastes is enabling bond on trace (BOT). The packaging solution of current solder metallurgy for BOT can result in an uncontrolled spreading of solder that leads to bump bridging and smaller chip gaps.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIGS. 1-7 are cross-sectional views of a method of forming a sintered conductive via in a foundation layer, according to one embodiment.

FIG. 8 is a process flow illustrating a method of forming a sintered conductive via in a foundation layer, according to one embodiment.

FIGS. 9-11A are perspective views of a method of forming a sintered conductive line in a foundation layer, according to one embodiment.

FIGS. 11B-12 are cross-sectional views of a method of forming a sintered conductive line in a foundation layer, according to one embodiment.

DETAILED DESCRIPTION

Described below are ways for forming ultra-fine pitch interconnects for solder on die (SOD) using solder paste printing (SPP). Methods of forming a sintered conductive via using a liquid phase sintering (or sinterable) (LPS) solder paste are described that enable SOD with ultra-fine pitch and bond on trace (BOT) with SOD. For one embodiment, a foundation layer includes a sintered conductive via formed on a die pad using an LPS paste printing process to enable ultra-fine pitches with taller standoff heights.

Embodiments of the foundation layer enhance packaging solutions. In addition, embodiments of the foundation layer help to enable sintered conductive vias with taller (or higher) bump heights and standoff heights using the LPS solder paste rather than a conventional solder paste. Embodiments of the foundation layer utilize the LPS solder paste to enable high aspect ratio solder bumps to overcome the limitations of SOD with SPP, which include the need for multiple paste prints and reflows.

Embodiments of the foundation layer also help to reduce or eliminate solder wicking and minimize the interaction of the fluxing carrier material with SOD resist (or photoresist). Further, embodiments of the foundation layer facilitate the formation of LPS solder columns (also referred to as sintered conductive lines), where the LPS solder columns include multiple conductive vias which are stacked and sintered together to form ultra-fine pitch interconnects. These LPS solder columns enable high-bandwidth, low-loss signal transmission for current panel level packaging technologies (e.g., between a logic die and a peripheral die). Accordingly, the packaging solutions of the foundation layer reduces thermal budget, thereby reducing cross-linking of SOD photoresist, and reduces or eliminates solder slumping/spread.

FIGS. 1-7 are cross-sectional views of a method of forming a sintered conductive via in a foundation layer 100. As used herein, a "LPS solder paste printing process" (LPS SPP process) may refer to a process used to form a sintered conductive via (or a sintered conductive column/line) that enables a SOD with an ultra-fine pitch. The sintered conductive vias replace the standard paste printing of vias with an alternative process that relies on LPS solder paste to define/print the sintered conductive vias. For some embodiments, the sintered conductive vias enable SODs with ultra-fine pitch interconnects by relatively eliminating solder wicking/spreading during the printing and reflow of the LPS solder paste (also referred to as LPS paste). Likewise, by implementing the LPS SPP process, the height (or standoff height) of the sintered conductive vias can be made much taller than existing SPP vias that are formed for SODs.

Figure 1:
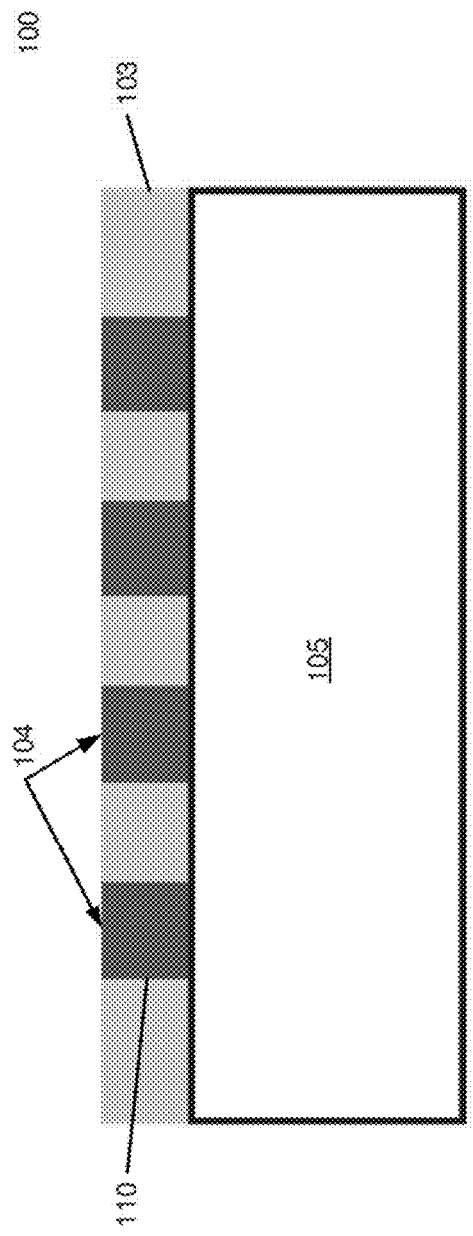

Referring now to FIG. 1, foundation layer 100 includes die pads 110, die 105, dielectric layer 103, and top portions 104 of die pads 110. For one embodiment, die pad 110 is formed over die 105 in foundation layer 100. For one embodiment, die 105 may be placed/formed over an adhesive layer or a rigid support/carrier (not shown), which can be made from a stainless steel.

Foundation layer 100 may include a packaging substrate and a printed circuit board. Foundation layer 100 may have a single photoresist layer or multiple photoresist layers, which may be stacked and stitched (also referred to as sintered and/or reflowed). Foundation layer 100 may also include a plurality of silicon dies (e.g., die 105) with a plurality of sintered solder conductive vias to form ultra-fine pitch first-level interconnects (FLI). For one embodiment, foundation layer 100 may also include multiple ultra-fine pitch interconnects that are stacked on top of each other and then stitched to form a sintered conductive column (or line).

Dielectric layer 103 is formed over die pad 110, die 105, and top portion 104 of die pad 110. For example, dielectric layer 103 is formed between the die gaps of the die pads 110. For one embodiment, dielectric layer 103 is made of a wafer-level underfill material, such as an epoxy with filler material, which forms a non-conducting resin between die pads 110. For example, the dielectric layer 103 may be a polymer material, such as, for example, polyimide, epoxy, or build-up film (BF).

For some embodiments, dielectric layer 103 is then recessed (not shown) to expose top portion 104 of die pad 110. For one embodiment, dielectric layer 103 is recessed using a mold grinding/polishing. Polished surface also provides a flat surface which improves the signal transmission and the resolution of the subsequent LPS SPP process.

For other embodiments, the dielectric layer 103 may be one layer in a stack that includes a plurality of dielectric layers used to form a build-up structure. As such, the dielectric layer 103 may be formed over another dielectric layer, photoresist layer, or seed layer (e.g., seed layer 1311a of FIG. 13).

Figure 2:
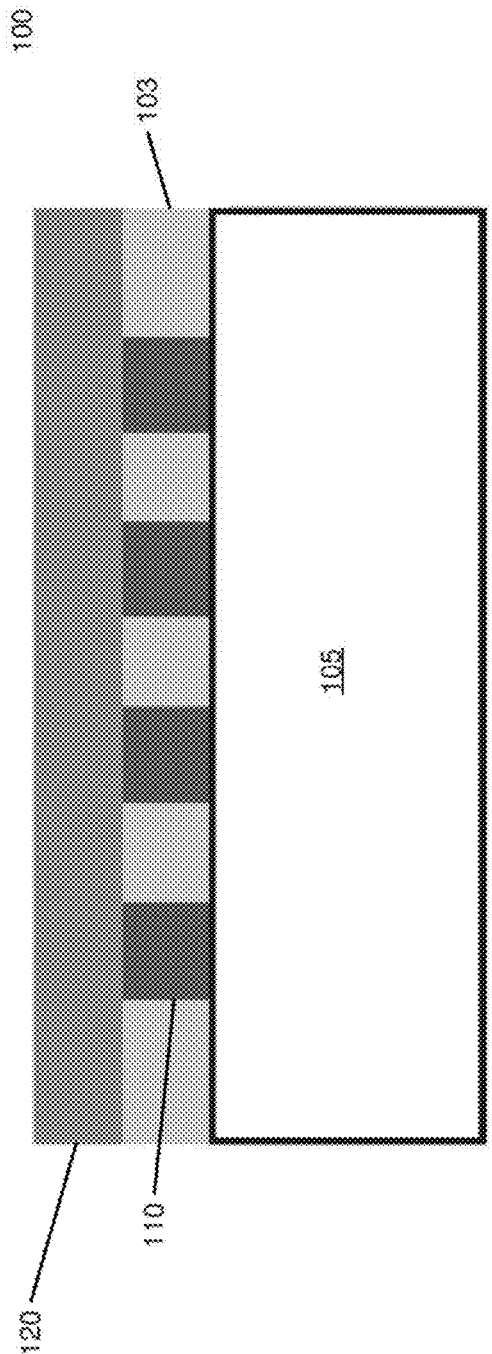

FIG. 2 illustrates photoresist layer 120 deposited over die pads 110, dielectric layer 103, and die 105. For some embodiments, photoresist layer 120 may include, but is not limited to, polyimides, epoxy acrylates, benzocyclobuten (BCB), polybenzoxazole (PBO), negative tone acrylic based resist, etc. For one embodiment, photoresist layer 120 may provide a via opening (e.g., via opening 122 of FIG. 4) in the foundation layer 100 that enables a desired scalability in terms of an ultra-fine pitch (e.g., <50 um) and a fine diameter (e.g., <20 um). As such, via openings with these desired definitions/dimensions can be drilled through the photoresist layer 120 with a lithographical process or a laser drilling process, as shown in FIGS. 3-4.

FIG. 3 shows the formation of via openings (as shown in FIG. 4) in foundation layer 100 by using a laser ablation/drilling process, a lithographical process, or any other processes known in the art. For one embodiment, the patterning of photoresist layer 120 may be implemented with lithographic (or laser drilling) patterning processes by exposing a radiation source (as shown by the arrows) through a routing layer mask 150 and then developed with a developer.

FIG. 4 illustrates photoresist layer 120 of foundation layer 100 patterned to form one or more via openings 122 over die pads 104. For some embodiments, the use of lithography-based (or laser-based) processes to form via openings 122 allows for the via openings 122 to be formed in any desired shape. Note that instead of being limited to the shape of the laser, a sintered conductive via (e.g., sintered via 141 of FIG. 6) and its via opening 122 may be customized for a desired purpose. For example, whereas a laser defined via opening may be limited to a circular shape, for some embodiments, foundation layer 100 may formed to have via openings that are rectangular or oval (in shape), or with hollow interiors that extend in a lateral direction along a conductive/transmission line.

FIG. 5 illustrates LPS solder paste 125 (also referred to as a non-collapsing solder paste) deposited into via openings 122 to form sintered conductive vias, as shown in FIG. 6. For some embodiments, a solder paste printing (SPP) process is used to deposit the LPS solder paste 125 into each via opening 122 of the foundation layer 100, where the LPS solder paste 125 forms above each die pad 110 of die 105. For example, the LPS solder paste 125 fills up and occupies the shape of via opening 122 that was patterned/formed on photoresist layer 120. For one embodiment, the SPP process includes, but is not limited to, an ambient printing, a pressure printing, a vacuum printing, or a combination thereof.

For one embodiment, LPS solder paste 125 is formed with a sinterable powder (e.g., sinterable filler of tin (Sn) and copper (Cu) spheres) that does not relatively collapse during reflow, and a benign carrier material that provides fluxing and cleanly decomposes upon high temperature exposure.

LPS solder paste 125 may form a sintered conductive via 141 (as shown in FIG. 6) that has a taller bump height and final standoff height paste for SOD. For one embodiment, the LPS solder paste 125 has relatively no slump properties with minimum solvent and organics (e.g., <5 wt %). As such, the relatively no slump characteristics of the LPS solder paste 125 enable taller standoff heights (e.g., as compared to a conventional solder paste) without multiple paste prints and reflows, as shown in FIG. 6. Likewise, for one embodiment, the low solvents/organics of the LPS solder paste 125 minimize the interaction of a fluxing carrier material (not shown) with photoresist layer 120. In addition, the LPS solder paste 125 of foundation layer 100 facilitates high aspect ratio sintered conductive vias without the need for multiple paste printing and reflow as shown in FIG. 6.

FIG. 6 illustrates the reflow/sintering process of the LPS solder paste 125 as it forms sintered conductive vias 141. For example, during the reflow process of FIG. 6 the LPS solder paste 125 may be heated to below melting point, where the Sn—Bi alloy particles (or any low temperature solder) melt into liquid Sn and Bi at higher temperature, the liquid Sn reacts with Cu particles as well with the adjacent metallized surface, and then the sinterable material bonds/fuses together to form the sintered conductive vias 141.

As shown in FIG. 6, the LPS solder paste 125 is sintered into via opening 122 and thus forms the sintered conductive via 141. The tall standoff height and relatively no wicking/spreading associated with the reflow process enables the LPS solder paste 125 solder on die (SOD) with an ultra-fine pitch. For example, a taller standoff height of the sintered conductive via 141 may improve reliability as stress mismatch can be spread over longer distances. Likewise, as shown in FIG. 6, SOD may be implemented when the LPS solder paste 125 is sintered and formed on die pad 110 of die 105. This also enables the sintered conductive via 141 to have an ultra-fine pitch, first-level interconnect.

Figure 7:
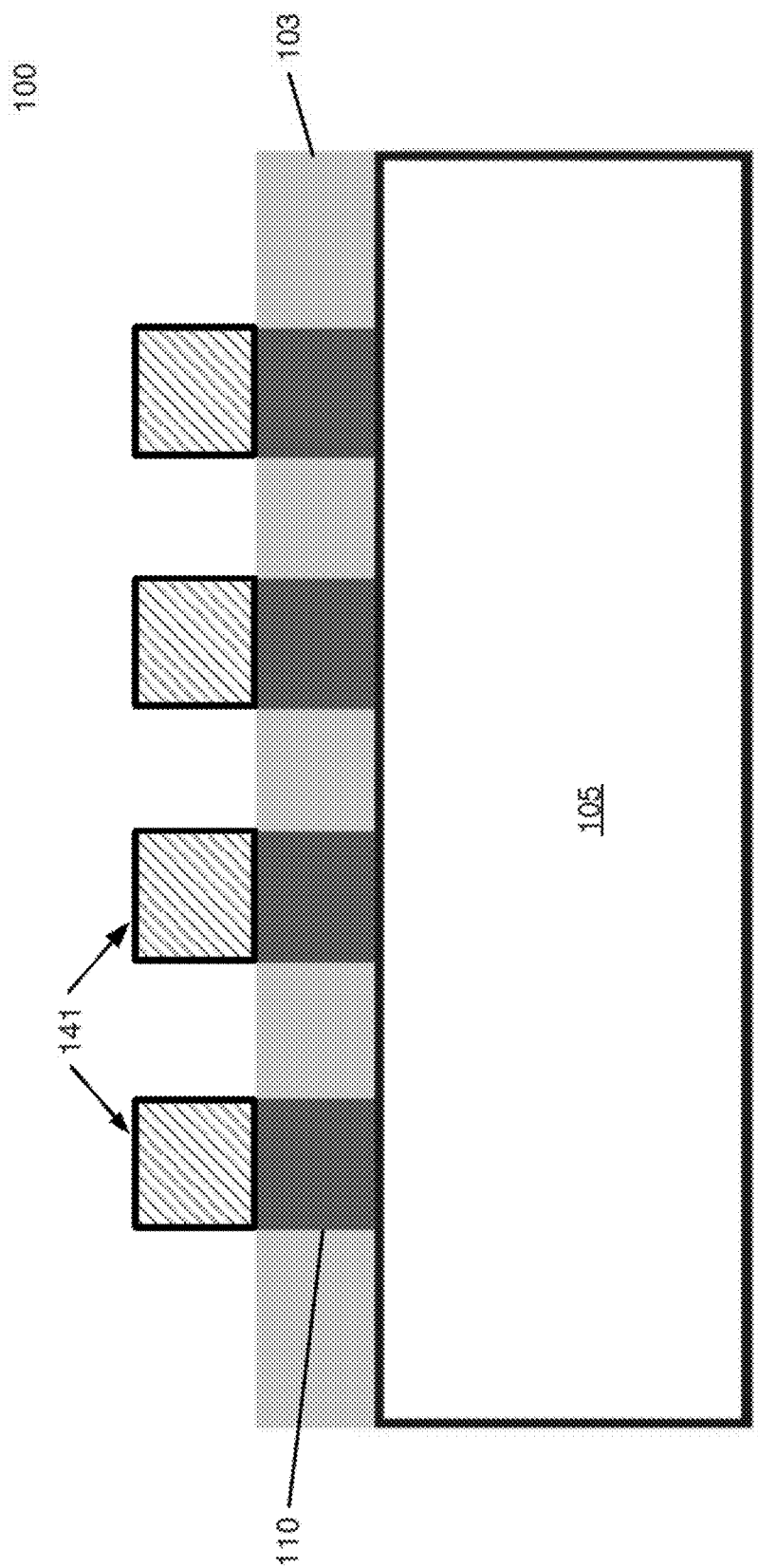

In addition, as the LPS solder paste 125 sinters into the sintered conductive via 141, where the no slump property of the LPS paste can result in tall solder bumps with a single paste printing process step. In comparison, a traditional solder paste would require multiple printing steps to achieve same solder height. Further, this minimizes the thermal budget of foundation layer 100 and prevents over crosslinking of the photoresist layer 120, which improves the removal/stripping of photoresist layer 120 (as shown in FIG. 7).

For some embodiments, the use of photoresist layer 120 with the LPS solder paste 125 relatively eliminates solder wicking on Cu post and results in sintered conductive vias 141 that have better coplanarity/lower bump thickness variation (BTV). In addition, an advantage of using LPS solder paste is that the sintering material stays in its printed shape even after sintering/bonding, without reflow or spread. Lastly, once the sintered conductive vias 141 are formed, photoresist layer 120 is then removed as shown in FIG. 7. For one embodiment, a chemical process may be used to remove photoresist layer 102. Note that, according one another embodiment, a regular solder bump (e.g., SAC305, SnCu, SnAg solder, etc.) may be printed on top of sintered conductive via 141 (i.e., the LPS conductive via may be capped with a regular solder bump). For example, capping a sintered conductive via with a solder bump may allow bonding of the respective bumps to any metal/pad finish using a conventional solder reflow/bonding process, and it may also potentially increase solder compliance. In addition, for some embodiments, after photoresist 102 has been stripped as shown in FIG. 7, the dielectric layer 103 may also be removed. For some alternative embodiments, the photoresist 102 and the dielectric layer 103 may be stripped together in a single process.

FIG. 8 is a process flow 800 illustrating a method of forming a sintered conductive via in a foundation layer. Process flow 800 shows a method of forming a sintered conductive via as shown in FIGS. 1-7. For one embodiment, process flow 800 may implement a lithographic (or a laser) patterning process as described herein. Process flow 800 enables a sintered conductive via 141 to have an ultra-fine pitch with SOD in a foundation layer (e.g., foundation layer 100 of FIGS. 1-7).

At block 805, processing flow forms a dielectric layer and a die pad over a die in a foundation layer as shown in FIG. 1. For one embodiment, the foundation layer is at least one of a substrate and a printed circuit board. At block 810, processing flow deposits a photoresist layer over the dielectric layer, the die pad, and the die as shown in FIG. 2. At block 815, process flow patterns the first photoresist layer with a mask and a radiation source as shown in FIG. 3. At block 820, process flow forms a via opening (i.e., post laser ablation) over the die pad as shown in FIG. 4. For one embodiment, one or more via openings may be formed over one or more die pads of the die in the foundation layer. For another embodiment, the via opening has substantially vertical sidewalls.

At block 825, processing flow deposits a LPS solder paste into the via opening to form a sintered conductive via as shown in FIG. 5. For one embodiment, the LPS solder paste is deposited into the via opening using a SOD with SPP process. At block 830, processing flow reflows/sinters the LPS solder paste to form the sintered conductive via, as shown in FIG. 6. At block 835, processing flow removes the photoresist layer from the foundation layer as shown in FIG. 7. For one embodiment, process flow may repeat blocks 810-835 to form a sintered conductive line (or column), which may include one or more sintered conductive vias that are stacked and sintered on top of each other to form the sintered conductive column (as shown in FIGS. 12-13).

Figure 9:
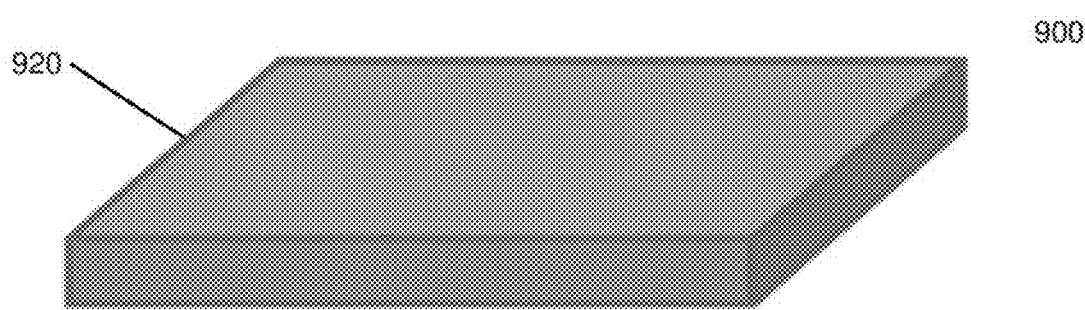
Figure 10:
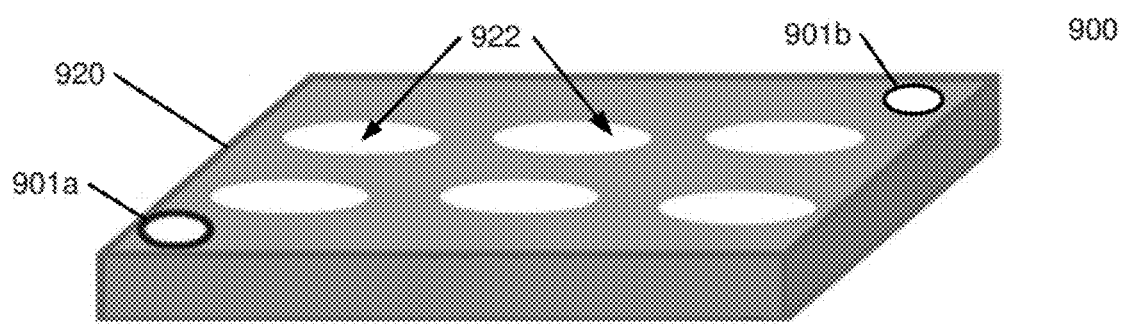
Figure 11A:
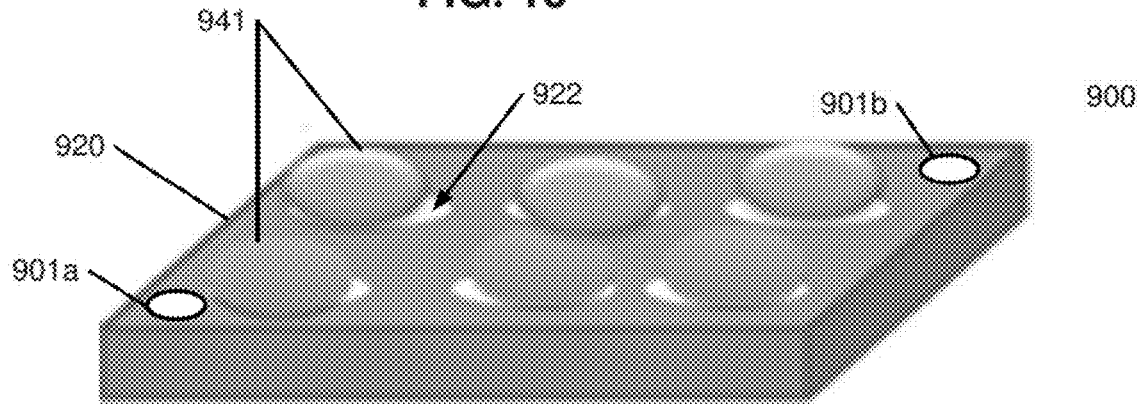
Figure 11B:
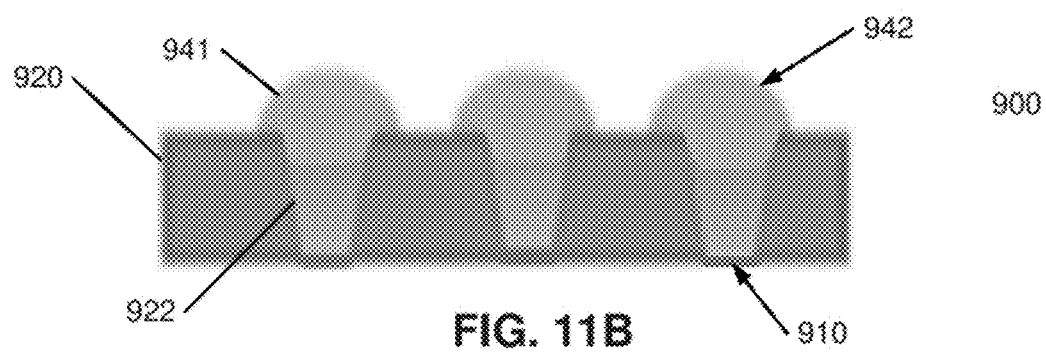

FIGS. 9-11A are perspective views of a method of forming a sintered conductive line in a foundation layer. FIGS. 11B-12 are cross-sectional views of a method of forming a sintered conductive line in a foundation layer. For one embodiment, as shown in FIG. 9, foundation layer 900 includes photoresist layer 920 that may be formed from a solder photoresist material or a polymer. For example, photoresist layer 920 may have a thickness of 50 um.

FIG. 10 illustrates a plurality of via openings 922 and one or more fiducials 901a-b that are formed on photoresist layer 920. For example, the via openings 922 formed on photoresist layer 920 have shown increased scalability in terms of fine pitch of <50 um and fine diameters of <20 um. Note that via openings of such dimensions can be formed using a lithographically or laser drilling process.

Figure 12:
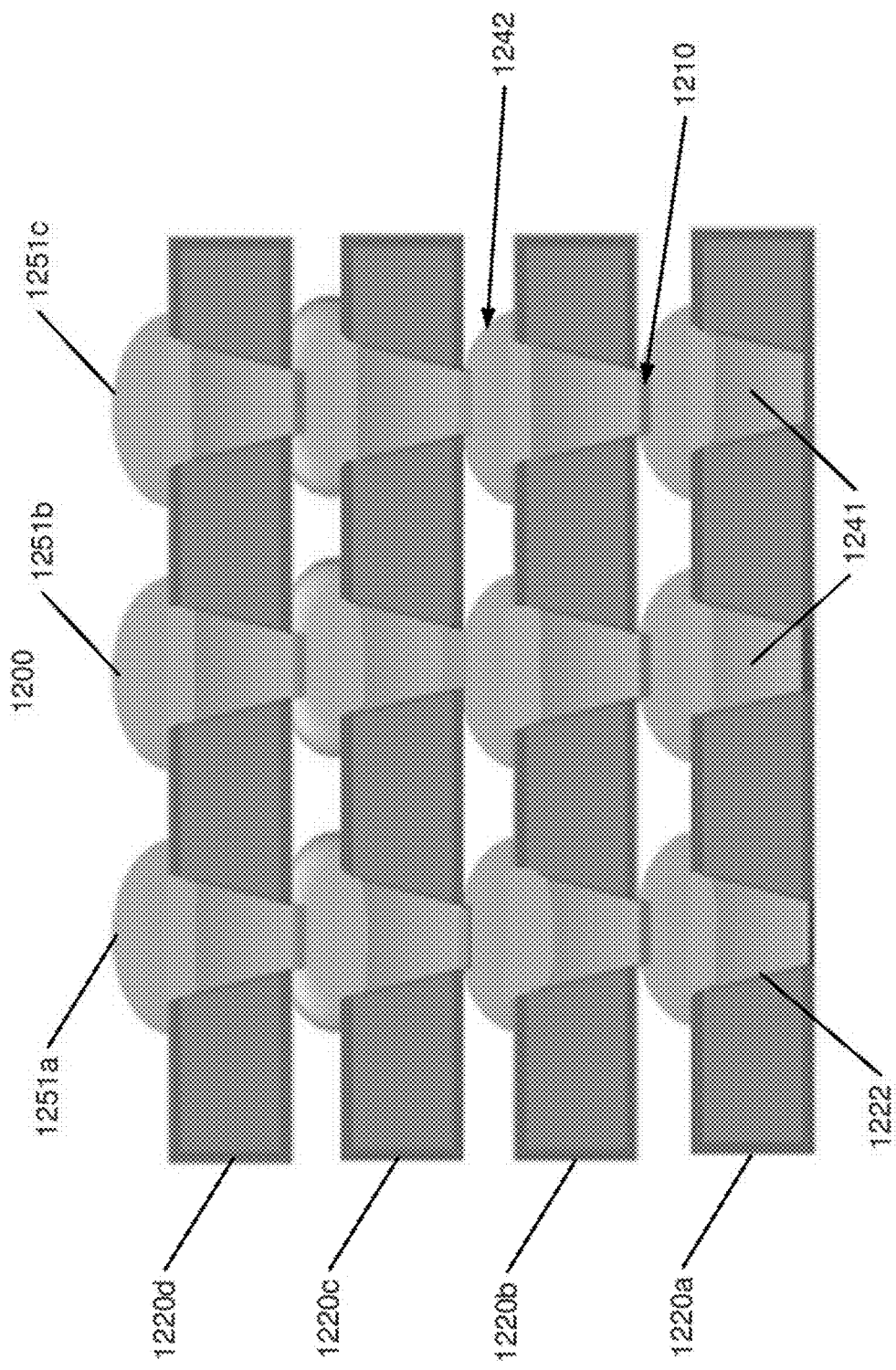
Figure 13:
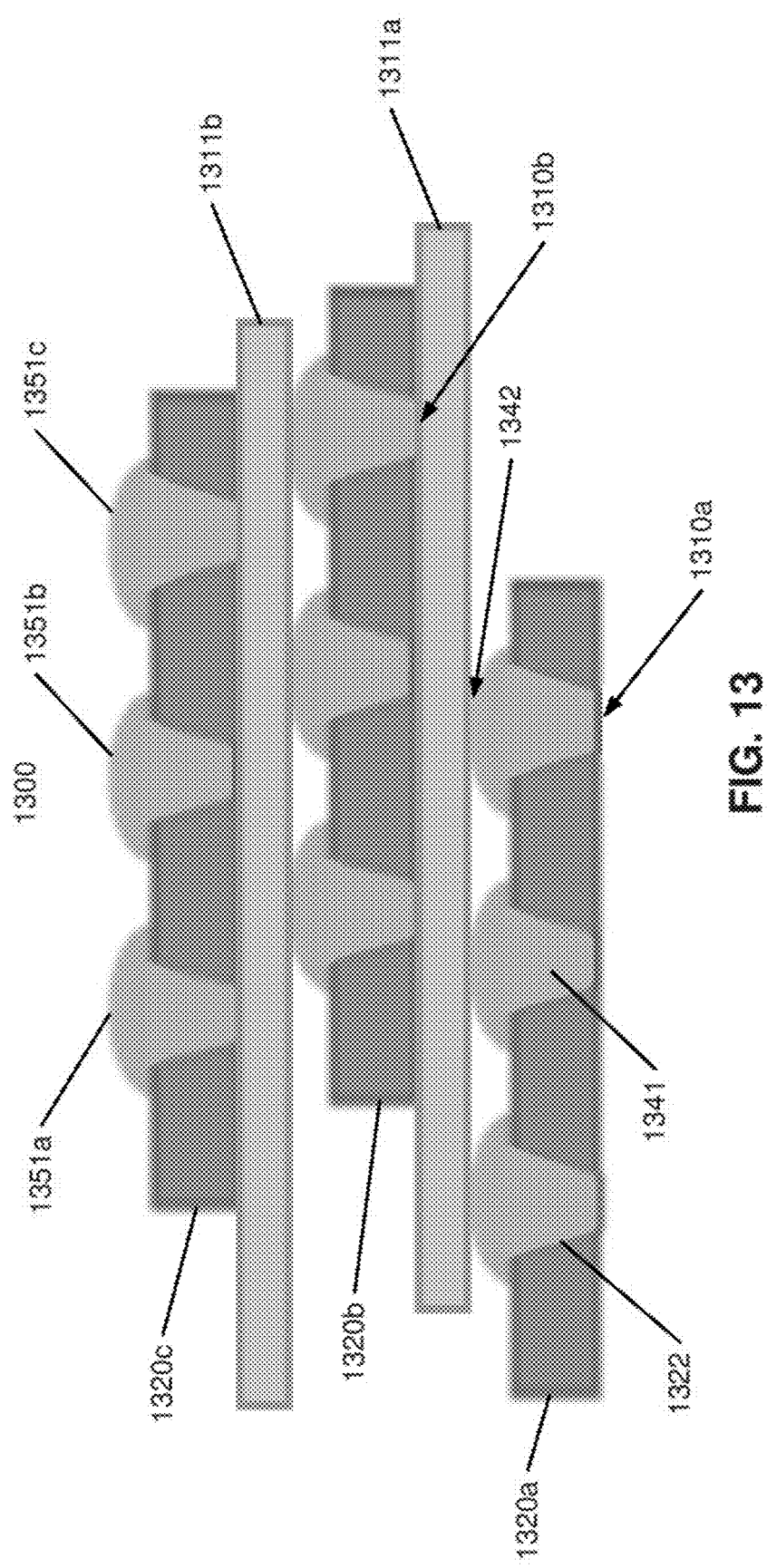
FIG. 13 is a cross-sectional view of a method of forming a foundation layer with a sintered conductive line that is staggered, according to one embodiment.

For one embodiment, fiducials 901a-b are formed on the photoresist layer 920 to provide alignment when the photoresist layer 920 is stacked on top or below another photoresist layer (as shown in FIG. 12). For some embodiments, the fiducials 901a-b may printed or drilled into photoresist layer 920.

FIG. 11A shows a LPS solder paste that is deposited into via openings 992 to form a plurality of sintered conductive vias 941. For one embodiment, each via opening 922 is deposited with the LPS solder paste (e.g., LPS solder paste 125 of FIG. 5), which fills up and occupies the shape of the via opening even after bonding/sintering. For another embodiment, a slight limitation with the printing process (or an electroplating process as shown in FIG. 12) is the overall thickness of the photoresist layer 120 (i.e., the depth of the via opening), which can be filled at the ultra-fine openings (e.g., 20 um diameter, 40 um pitch, or finer) as described above. For example, at such ultra-fine dimensions, a via opening may be filled with the LPS solder paste up to the overall thickness of the photoresist layer 120 (e.g., 50 um) as shown in FIG. 11B.

In addition, as shown in FIG. 11B, the sintered conductive via 941 may have a LPS solder paste cap 942 at the top end of the sintered conductive via 941. For one embodiment, during the SPP process, the LPS solder paste may be slightly overprinted onto the via opening 922 to enable stitching/sintering to another stack of photoresist layer as shown in FIG. 12. Note that regular solder paste (e.g., SnAg, SnCu etc.) can be used as the overprint layer to enable stitching to other layers.

FIG. 12 shows sintered conductive lines (or columns) 1251a-c that are formed in a foundation layer 1200. Foundation layer 1200 is similar to foundation layer 900 of FIGS. 9-11B, however foundation layer 1200 is formed from one or more foundation layers that are stacked on top of each other and stitched/sintered together.

For one embodiment, foundation layer 1200 includes, but is not limited to, photoresist layers 1220a-d (e.g., each layer having a 50 um thickness), via openings 1222, sintered conductive vias 1241, LPS solder paste caps 1242, and sintered conductive columns 1251a-c. To form foundation layer 1200, for example, one or more photoresist layers 1220a-d with via openings 1222 that are filled with LPS solder paste (or plated copper) are stacked on top of each other and aligned with fiducials (not shown).

For another embodiment, once each photoresist layer 1220a-d are stacked together, the photoresist layers 1220a-d may then be sintered/stitched together, as shown by the LPS solder paste cap 1242 and bottom portion 1210 of the sintered conductive via 1241 stitching together to form sintered conductive line 1251c. For example, the photoresist layer 1220a-d may be sintered using the reflow process as described above in FIG. 6. Foundation layer 1200 thus enables a plurality of sintered conductive vias 1241 to form a plurality of sintered conductive lines 1251a-c.

In addition, foundation layer 1200 may be implemented with a SPP process in an embedded multi-die interconnect packaging, which may provide tall solder columns for fine pitch interconnects. For example, a foundation layer (as shown in FIG. 12) may include an interposer, such as a discrete interposer for die-to-die bonding. As such, the foundation layer can be used for die-to-die bonding of a central processing unit (CPU) die to a multi-chip package (MCP) die via vertical interconnects (e.g., sintered conductive lines 1251), which have a fine pitch vertical connection between the dies. Also note that the stacked and stitched process (as illustrated in FIG. 12) can be used to form multiple ultra-fine interconnects in various semiconductor devices.

FIG. 13 a foundation layer 1300 formed with a plurality of sintered conductive line 1351a-c that are staggered (also referred to as staggered sintered conductive lines). For alternative embodiments, foundation layer 1300 enables seed layers 1311a-b (i.e., electro-plating) to be stacked between photoresist layers 1320a-c. In addition, conductive vias 1341 of foundation layer 1300 may be formed with a LPS solder paste and/or a metal filling material, such as copper that provides a high current carrying capacity over solders.

For some embodiments, seed layers 1311a-b include a Titanium, Copper (Ti/Cu) seed layer that is sputtered. For one embodiment, to form foundation layer 1300, a first photoresist layer 1320a is filled with LPS solder paste to form sintered conductive vias 1341 that have LPS solder caps 1342, where a first seed layer 1311a is placed above the LPS solder caps 1342. Then a second photoresist layer 1320b that has sintered conductive vias 1341 is formed above the first seed layer 1311a. Accordingly, a second seed layer 1311b is then placed above the LPS solder caps 1342 of the second photoresist layer 1320b, where a third photoresist layer 1320c is thus formed above the second seed layer 1311b.

Foundation layer 1300 enables electroplating of copper in vias followed by stitching microvias with LPS solder paste. In addition, foundation layer 1300 also facilitates stacking a layer-by-layer buildup with both stacked and staggered vias (e.g., sintered conductive lines 1351a-c). Note that foundation layer 1300 may be aligned with fiducials (not shown).

Figures 14A, 14B:
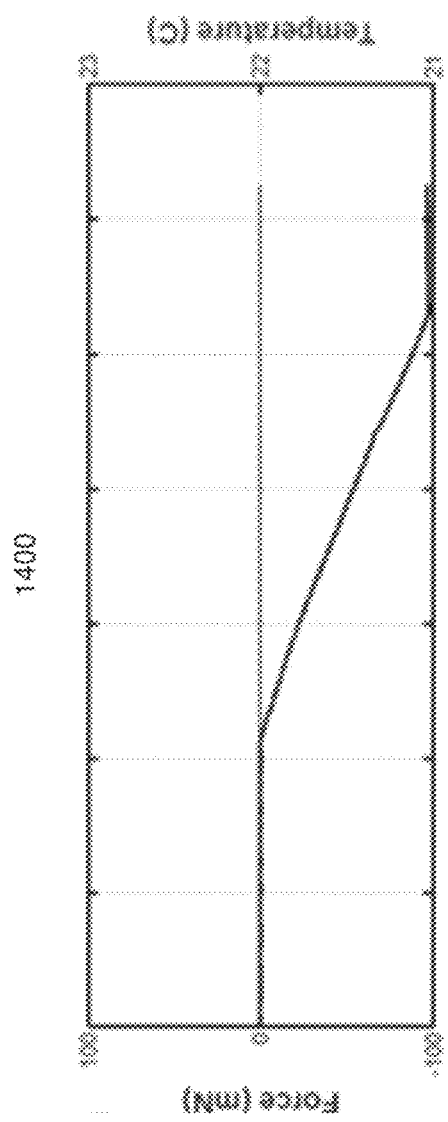
FIG. 14A is a graph illustrating a force test result on a conventional conductive via, according to one embodiment.
FIG. 14B is a graph illustrating a force test result on a sintered conductive via, according to one embodiment.

FIG. 14A is a graph 1400 illustrating a force test result on a conventional conductive via. FIG. 14B is a graph 1450 illustrating a force test result on a sintered conductive via. For one embodiment, graph 1450 shows a 30 um sintered conductive via that was deformed at a peak load of 100 mN, and thus has an estimated compliance of 0.3 um/mN. Meanwhile, graph 1400 shows a conventional 40 um solder bump that was deformed by ~10 um at a peak load of 100 mN, and thus has an estimated compliance of 0.1 um/mN. As such, graph 1450 shows that the LPS sintered vias have about 3 times higher force/deformation compliance compared to conventional lead-free solder bumps.

Figure 15:
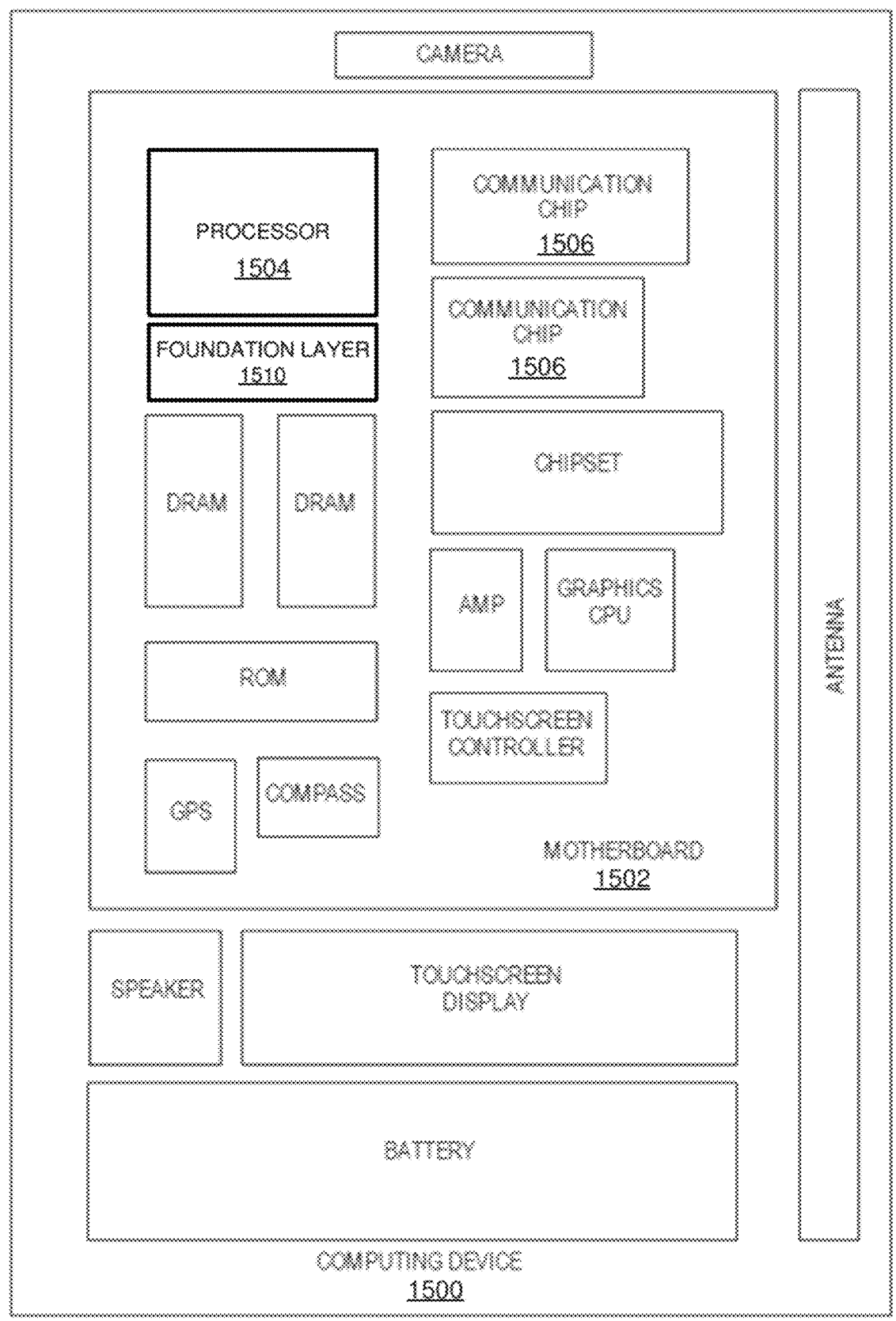
FIG. 15 is a schematic block diagram illustrating a computer system that utilizes a foundation layer, according to one embodiment.

FIG. 15 is a schematic block diagram illustrating a computer system that utilizes a foundation layer, according to one embodiment. FIG. 15 illustrates an example of computing device 1500. Computing device 1500 houses motherboard 1502. Motherboard 1502 may include a number of components, including but not limited to processor 1504, foundation layer 1510, and at least one communication chip 1506. Processor 1504 is physically and electrically coupled to motherboard 1502. For some embodiments, at least one communication chip 1506 is also physically and electrically coupled to motherboard 1502. For other embodiments, at least one communication chip 1506 is part of processor 1504.

Depending on its applications, computing device 1500 may include other components that may or may not be physically and electrically coupled to motherboard 1502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 1506 enables wireless communications for the transfer of data to and from computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 1506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

Processor 1504 of computing device 1500 includes an integrated circuit die packaged within processor 1504. Foundation layer 1510 may be a SOD die, a packaging substrate, and/or a printed circuit board. Foundation layer 1510 may include one or more sintered conductive vias (e.g., LPS sintered conductive vias). Further, the one or more sintered conductive vias of foundation layer 1510 may enable BOT using SOD with SPP (e.g., LPS solder paste) to form one or more ultra-fine pitch interconnections. For example, foundation layer 1510 may use LPS solder paste defined vias to provide LPS conductive lines (e.g., LPS solder columns or LPS solder filled vias) that are stacked and sintered to form ultra-fine pitch interconnects. Note that foundation layer 1510 may be a single component, a subset of components, and/or an entire system, as such LPS conductive vias may be limited to foundation layer 1510 and/or any other component that requires LPS conductive vias.

For some embodiments, the integrated circuit die may be packaged with one or more devices on foundation layer 1510 that includes a thermally stable RFIC and antenna for use with wireless communications. The term "processor" may refer to any device or portion of a device that processes electronic data from registers and/or memory to transform that electronic data into other electronic data that may be stored in registers and/or memory.

At least one communication chip 1506 also includes an integrated circuit die packaged within the communication chip 1506. For some embodiments, the integrated circuit die of the communication chip may be packaged with one or more devices on foundation layer 1510, as described herein, to provide sintered conductive vias that form ultra-fine pitch interconnects.

The following examples pertain to further embodiments. The various features of the different embodiments may be variously combined with some features included and others excluded to suit a variety of different applications.

The following examples pertain to further embodiments:

For one embodiment, a foundation layer comprising: a plurality of die pads formed over a die; a dielectric layer formed over the plurality of die pads and the die, wherein the dielectric layer is recessed to expose top portions of the plurality of die pads; and a first plurality of sintered conductive vias formed over the plurality of die pads, wherein each of the sintered conductive vias is coupled to at least one of the plurality of die pads.

For one embodiment of the foundation layer, further comprising: a photoresist layer formed over the dielectric layer and the top portions of the die pads; and a plurality of via openings formed in the photoresist layer.

For one embodiment of the foundation layer, further comprising a second plurality of sintered conductive vias formed over the first plurality of sintered conductive vias to form a plurality of sintered conductive lines.

For one embodiment of the foundation layer, wherein the dielectric layer comprises a polymer material.

For one embodiment of the foundation layer, wherein each sintered conductive via is coupled to at least one die pad by the exposed top portion of the die pad formed in the dielectric layer.

For one embodiment of the foundation layer, wherein the photoresist layer is removed after the first plurality of sintered conductive vias are formed.

For one embodiment of the foundation layer, wherein each of the first and second sintered conductive vias are formed with a liquid phase sintering (LPS) solder paste.

For one embodiment of the foundation layer, wherein the LPS solder paste comprises at least one of a sinterable powder and a carrier material.

For one embodiment of the foundation layer, further comprising a printed circuit board.

For some embodiments, a method of forming a foundation layer, the method comprising: depositing a photoresist layer over a dielectric layer, a die pad, and a die; patterning the first photoresist layer to form a via opening over the die pad; and depositing a LPS solder paste into the via opening to form a first sintered conductive via, wherein the LPS solder paste is sintered to form the first sintered conductive via.

For another embodiment, the method further comprising: forming the dielectric layer and the die pad over the die prior to depositing the photoresist layer; and recessing the dielectric layer to expose a top portion of the die pad.

For one embodiment of the method, wherein the die comprises a plurality of die pads.

For one embodiment of the method, wherein patterning the first photoresist layer comprises a mask and a radiation source.

For another embodiment, the method further comprising forming a second sintered conductive via over the first sintered conductive via to form a sintered conductive line.

For one embodiment of the method, wherein the first sintered conductive via is coupled to the die pad by the exposed top portion of the die pad formed in the dielectric layer.

For another embodiment, the method further comprising removing the photoresist layer after the first sintered conductive via is formed.

For other embodiments, a foundation layer comprising: a first plurality of via openings formed over a first photoresist layer; a first plurality of sintered conductive vias formed over the first plurality of via openings; a second plurality of via openings formed over a second photoresist layer; a second plurality of sintered conductive vias formed over the second plurality of via openings; and the second photoresist layer with the second plurality of sintered conductive vias stacked above the first photoresist layer with the first plurality of sintered conductive vias to form a plurality of sintered conductive lines.

For one embodiment of the foundation layer, wherein each of the sintered conductive lines is coupled to at least one of a plurality of die pads formed over one or more dies.

For one embodiment of the foundation layer, wherein the plurality of die pads include top portions formed over the plurality of die pads, and wherein each of the sintered conductive lines is coupled to one of the plurality of die pads by the top portions of the plurality of die pads.

For one embodiment of the foundation layer, wherein each of the sintered conductive vias and the sintered conductive lines are formed with a liquid phase sintering (LPS) solder paste.

For one embodiment of the foundation layer, wherein the LPS solder paste comprises at least one of a sinterable powder and a carrier material.

For one embodiment of the foundation layer, further comprising a printed circuit board.

In the foregoing specification, embodiments have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A method of forming a foundation layer, the method comprising: depositing a photoresist layer over a dielectric layer, a die pad, and a die;
patterning the first photoresist layer to form a via opening over the die pad;
and depositing a LPS solder paste into the via opening to form a first sintered conductive via, wherein the LPS solder paste is sintered to form the first sintered conductive via, and further comprising forming a second sintered conductive via over the first sintered conductive via to form a sintered conductive line.

2. The method of claim 1, further comprising:
    forming the dielectric layer and the die pad over the die prior to depositing the photoresist layer; and
    recessing the dielectric layer to expose a top portion of the die pad.

3. The method of claim 1, wherein the die comprises a plurality of die pads.

4. The method of claim 1, wherein patterning the first photoresist layer comprises a mask and a radiation source.

5. The method of claim 1, wherein the first sintered conductive via is coupled to the die pad by the exposed top portion of the die pad formed in the dielectric layer.

6. The method of claim 1, further comprising removing the photoresist layer after the first sintered conductive via is formed.

7. A method of forming a foundation layer, the method comprising:

forming a plurality of via openings in a photoresist layer;
forming a fiducial on the photoresist layer;
depositing a solder paste in the plurality of via openings in the photoresist layer; and
sintering the solder paste to form a plurality of conductive vias in the via openings in the photoresist layer.

8. The method of claim 7, wherein forming the fiducial on the photoresist layer comprises printing fiducial on the photoresist layer.

9. The method of claim 7, wherein forming the fiducial on the photoresist layer comprises drilling into the photoresist layer.

10. The method of claim 7, further comprising:
forming a solder paste cap on the plurality of conductive vias.

11. The method of claim 7, wherein sintering the solder paste to form the plurality of conductive vias comprises forming the plurality of conductive vias above and over portions of the photoresist layer.

12. The method of claim 7, wherein forming the plurality of via openings in the photoresist layer comprises a lithographic process.

13. The method of claim 7, wherein forming the plurality of via openings in the photoresist layer comprises a laser drilling process.

14. A method of forming an interconnect structure, the method comprising:
forming a plurality of foundation layers, the forming comprising:
forming a plurality of via openings in a photoresist layer;
forming a fiducial on the photoresist layer;
depositing a solder paste in the plurality of via openings in the photoresist layer; and
sintering the solder paste to form a plurality of conductive vias in the via openings in the photoresist layer; and
stacking the plurality of foundation layers by coupling the plurality of conductive vias of the plurality of foundation layers, wherein the fiducial on the photoresist layer of each foundation layer is used to align the plurality of foundation layers for the stacking.

15. The method of claim 14, wherein forming the fiducial on the photoresist layer comprises printing fiducial on the photoresist layer.

16. The method of claim 14, wherein forming the fiducial on the photoresist layer comprises drilling into the photoresist layer.

17. The method of claim 14, wherein sintering the solder paste to form the plurality of conductive vias comprises forming the plurality of conductive vias above and over portions of the photoresist layer.

18. The method of claim 14, wherein forming the plurality of via openings in the photoresist layer comprises a lithographic process.

19. The method of claim 14, wherein forming the plurality of via openings in the photoresist layer comprises a laser drilling process.

* * * * *